(12) United States Patent
Lee

(10) Patent No.: US 9,349,744 B2
(45) Date of Patent: May 24, 2016

(54) SEMICONDUCTOR DEVICE AND METHOD OF MANUFACTURING THE SAME

(71) Applicant: SK hynix Inc., Icheon-si Gyeonggi-do (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/203,745

(22) Filed: Mar. 11, 2014

(65) Prior Publication Data

US 2015/0137209 A1 May 21, 2015

(30) Foreign Application Priority Data

Nov. 15, 2013 (KR) .................. 10-2013-0138890

(51) Int. Cl.
*H01L 27/115* (2006.01)
*H01L 29/66* (2006.01)
*H01L 29/792* (2006.01)

(52) U.S. Cl.
CPC .... *H01L 27/11582* (2013.01); *H01L 29/66833* (2013.01); *H01L 29/7926* (2013.01)

(58) Field of Classification Search
CPC ................... H01L 27/11582; H01L 27/11578; H01L 27/11556; H01L 2924/0002; H01L 27/11568; H01L 2924/00; H01L 27/1157
See application file for complete search history.

(56) References Cited

U.S. PATENT DOCUMENTS

| | | | | |
|---|---|---|---|---|
| 2011/0298013 | A1* | 12/2011 | Hwang et al. | .................. 257/208 |
| 2012/0052673 | A1* | 3/2012 | Yoo et al. | ....................... 438/591 |
| 2012/0205722 | A1* | 8/2012 | Lee et al. | ....................... 257/211 |
| 2013/0292757 | A1* | 11/2013 | Aritome | ............ H01L 27/11556 257/316 |

FOREIGN PATENT DOCUMENTS

KR 1020130089076 A 8/2013

* cited by examiner

*Primary Examiner* — Tony Tran
(74) *Attorney, Agent, or Firm* — William Park & Associates Ltd.

(57) ABSTRACT

A semiconductor device includes a first channel layer, a second channel layer protruding from the first channel layer, a pipe gate including a silicide area surrounding the first channel layer, a tunnel insulating layer surrounding the second channel layer, a data storage layer surrounding the second channel layer with the tunnel insulating layer interposed therebetween, and interlayer insulating layers and conductive patterns which are alternately stacked while surrounding the second channel layer with the data storage layer and the tunnel insulating layer interposed therebetween.

7 Claims, 24 Drawing Sheets

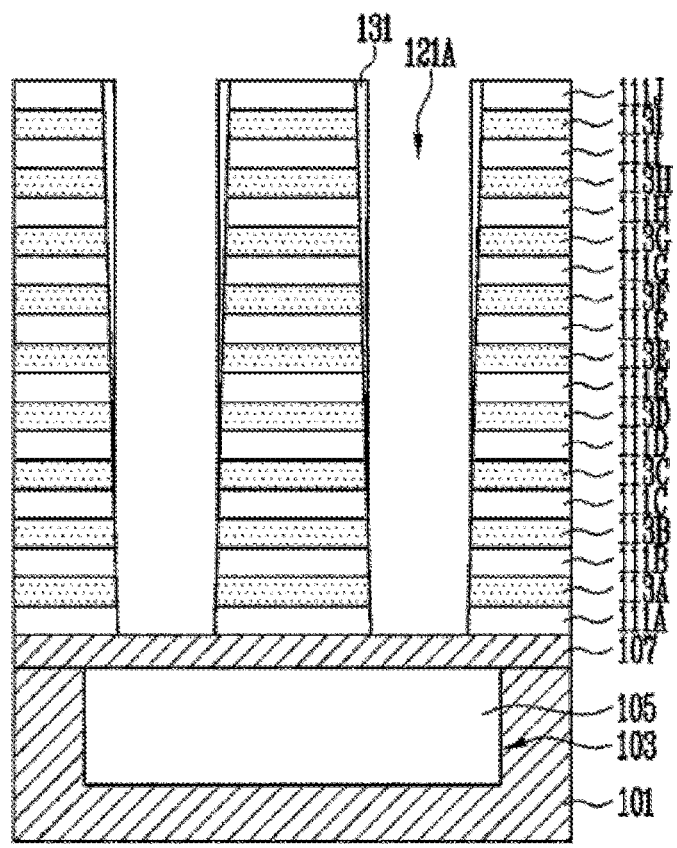

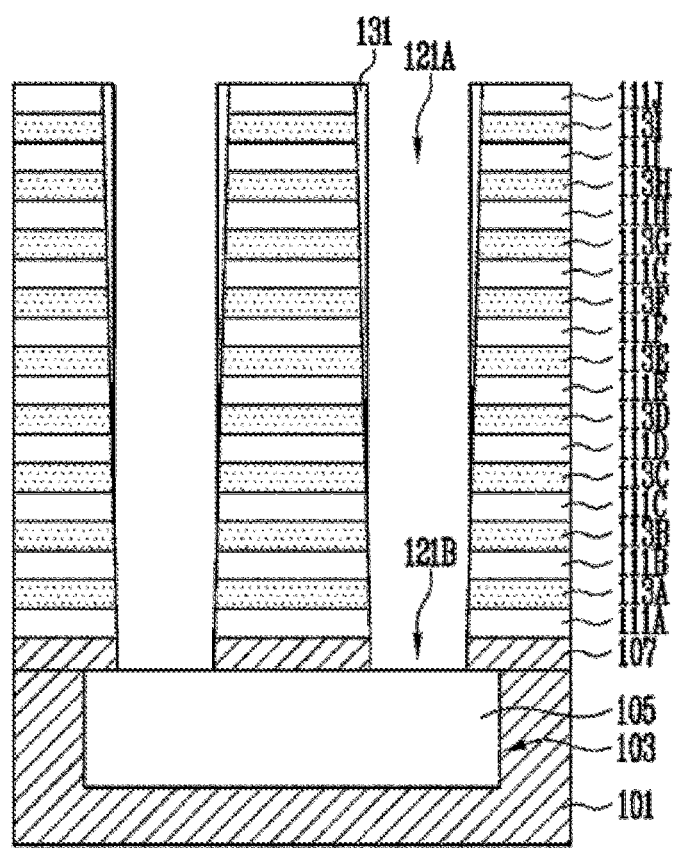

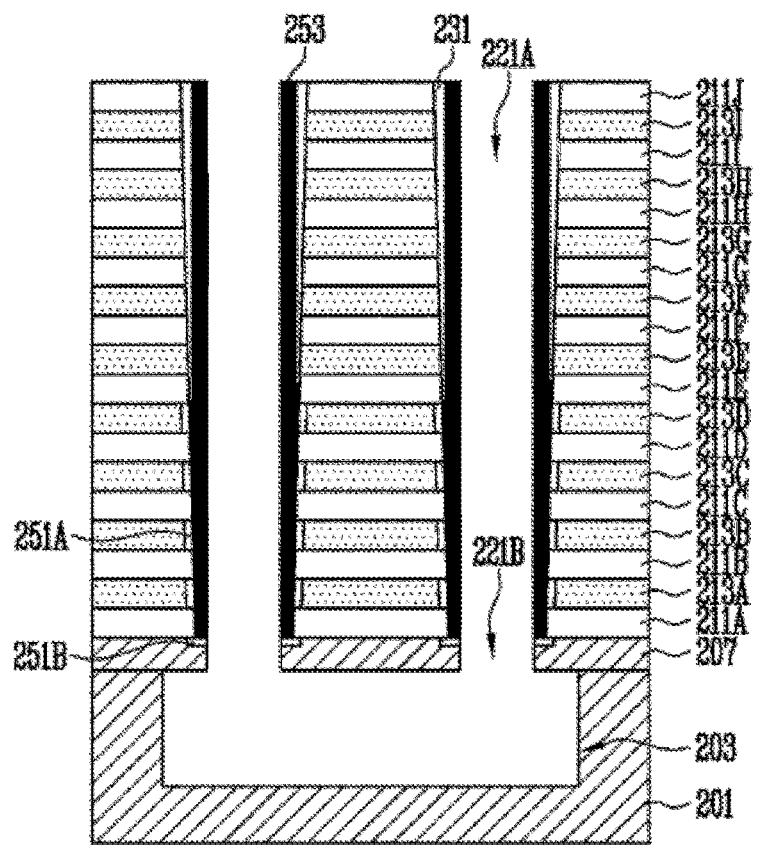

SEMICONDUCTOR DEVICE AND METHOD OF MANUFACTURING THE SAME

CROSS-REFERENCE TO RELATED APPLICATION

The present application claims priority to Korean patent application number 10-2013-0138890 filed on Nov. 15, 2013, in the Korean Intellectual Property Office, the entire disclosure of which is incorporated by reference herein.

BACKGROUND

1. Technical Field

The present invention generally relates to a semiconductor device and a method of manufacturing the same, more specifically, to a semiconductor device including a cell string of a three-dimensional structure, and a method of manufacturing the same.

2. Related Art

Generally, a cell string of a semiconductor device is formed to be a two-dimensional structure in which memory cells are formed to be a single layer on a substrate. In this way, integration of the two-dimensional cell string can be increased by using a fine pattern forming technology and reducing a flat area occupied by the memory cells.

As the above-described technology for increasing the integration of the two-dimensional cell string has come to a limit, a three-dimensional cell string in which memory cells are stacked on a substrate in multiple layers has been proposed. Integration of the three-dimensional cell string can be increased without reducing a flat area occupied by the memory cells.

The three-dimensional cell string includes memory cells connected in series and disposed in various structures. For example, the three-dimensional cell string may include a cell string by connecting the memory cells stacked in two rows with a pipe transistor. In this case, due to limitations in a conventional manufacturing process, a gate material of the pipe transistor has its limits. More specifically, a gate of the pipe transistor is formed of silicon. Accordingly, it is difficult to obtain a stable operation characteristic of the pipe transistor thereby degrading reliability of the semiconductor device.

SUMMARY

A semiconductor device according to an embodiment of the present disclosure may include a first channel layer, a second channel layer protruding from the first channel layer, a pipe gate including a silicide area surrounding the first channel layer, a tunnel insulating layer surrounding the second channel layer, a data storage layer surrounding the second channel layer with the tunnel insulating layer interposed therebetween, and interlayer insulating layers and conductive patterns which are alternatively stacked while surrounding the second channel layer with the data storage layer and the tunnel insulating layer interposed therebetween.

A semiconductor device according to an embodiment of the present disclosure may include a pipe gate including a trench and formed of a silicon material and a metal material; a word line stacking structure formed on the pipe gate, wherein the word line stacking structure includes a through hole connected to the trench; a first channel layer formed along a surface of the trench; a second channel layer formed on a sidewall of the through hole; and a gate insulating layer including a first gate insulating layer formed between the pipe gate and the first channel layer and a second gate insulating layer formed between the word line stacking structure and the second channel layer, wherein a thickness of the first gate insulating layer is smaller than that of the second gate insulating layer.

A method of manufacturing a semiconductor device according to an embodiment of the present disclosure may include forming a structure including a silicon layer having a trench, and interlayer insulating layers and first sacrificial layers, which are alternatively stacked on the silicon layer and penetrated through a through-hole connected to the trench, transforming the silicon layer into a metal silicide layer using a silicidation process, and forming a channel layer in the through-hole and the trench.

BRIEF DESCRIPTION OF THE DRAWINGS

The above and other features and advantages of the present disclosure will become more apparent to those of ordinary skill in the art by describing in detail various examples of embodiments thereof with reference to the attached drawings in which:

FIGS. 2A to 2K are cross-sectional views illustrating a method of manufacturing a cell string according to an embodiment of the present disclosure;

FIGS. 3A to 3E are cross-sectional views illustrating a method of manufacturing a cell string according to another embodiment of the present disclosure;

DETAILED DESCRIPTION

Figure 1:
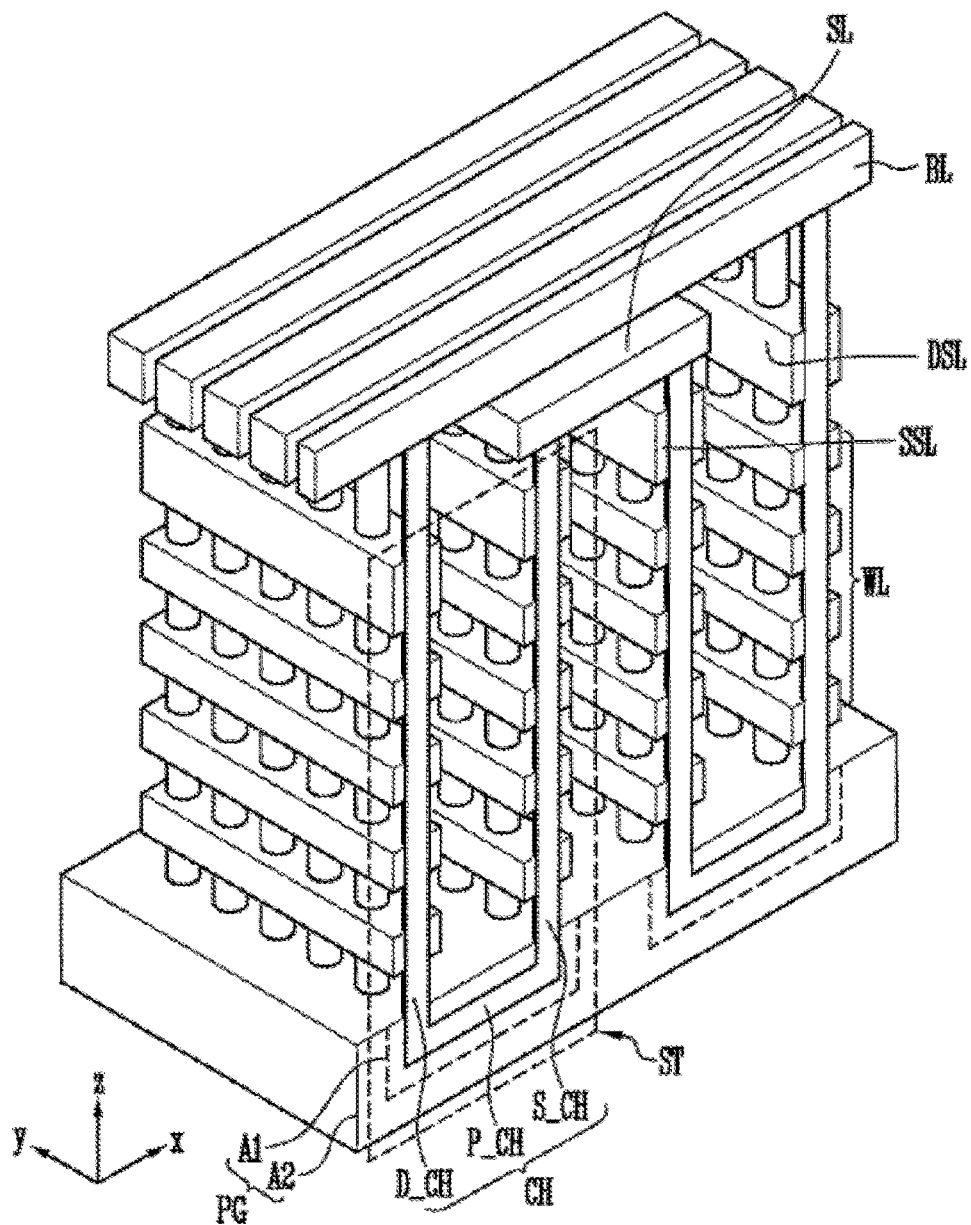
FIG. 1 is a perspective view illustrating a structure of a cell string of a semiconductor device according to an embodiment of the present disclosure.

Hereinafter, the preferred embodiments of the present disclosure will be described. In the drawings, the sizes and relative sizes of layers and regions are described for convenience of descriptions, which may be exaggerated for clarity. In the following description, the known configurations that are not related to a gist of the present disclosure will be omitted. When configuration elements of each drawing are denoted by reference numerals, it should be noted that even the same configurations which have been already shown in the other drawing have the same reference numerals.

FIG. 1 is a perspective view illustrating a structure of a cell string of a semiconductor device according to an embodiment of the present disclosure. In FIG. 1, insulating layers will not be illustrated for convenience of description.

As illustrated in FIG. 1, a cell string ST of a semiconductor device according to an embodiment of the present disclosure includes a channel layer CH connected between a bit line BL and a source line SL, memory cells connected to word lines WL, a drain select transistor connected to a drain select line DSL, and a source select transistor connected to a source select line SSL. The source select transistor, the memory cells, and the drain select transistor are connected in series between the bit line BL and the source line SL through the channel layer CH. The bit line BL may extend in a first direction, for example, an x direction of xyz coordinate systems in the FIG. 1, and the source line SL, which is disposed below the bit line BL, may extend along a second direction, for example, a y direction of xyz coordinate systems intersecting the first direction. The bit line BL may be electrically insulated from the source line SL. Further, the bit line BL is substantially crossed to the source line SL. The cell strings ST adjacent to the second direction may be connected to one source line SL in common, and the cell strings ST adjacent to the first direction may be connected to one bit line BL in common.

The channel layer CH includes a first channel layer P_CH and second channel layers D_CH and S_CH. The second channel layers D_CH and S_CH are connected to the first channel layer P_CH and protrude from the first channel layer P_CH toward the z direction of xyz coordinate systems. The second channel layers D_CH and S_CH include a drain side channel layer D_CH connected to the bit line BL and a source side channel layer S_CH connected to the source line SL.

The first channel layer P_CH, which is surrounded by a pipe gate PG, is used as a channel of a pipe transistor. The pipe gate PG includes a first area A1 surrounding the first channel layer P_CH and a second area A2 surrounding the first area A1. The first area A1 of the pipe gate PG may be a silicide area. The silicide area is an area in which a silicon layer is transformed into a metal silicide layer using a silicidation process. The second area A2 of the pipe gate PG may be either the silicide area formed through the same silicidation process as that of the first area A1, or a remaining silicon area without any reaction with a metal during the silicidation process. In this way, the pipe gate PG according to an embodiment of the present disclosure includes the silicide area with a low resistance compared to the silicon area, so that the resistance of the pipe gate PG can be reduced. As a result, it is possible to reduce program disturb and read disturb of a three-dimensional cell string ST including the pipe transistor.

The word lines WL, which are disposed on the pipe gate PG, are stacked while surrounding the drain side channel layer D_CH or the source side channel layer S_CH. The drain select line DSL surrounds the drain side channel layer D_CH and is disposed on the word lines WL. The source select line SSL surrounds the source side channel layer S_CH and is disposed on the word lines WL. The word lines WL, the drain select line DSL, and the source select line SSL may extend along the second direction intersecting the first direction.

Outer walls of the first channel layer P_CH and the second channel layers S_CH and D_CH may be surrounded by insulating structures (not shown) including at least one of a tunnel insulating layer, a data storage layer, a first oxide layer, and a second oxide layer. The insulating structures may be a gate insulating layer or multi-function layers. For example, a first insulating structure between the first channel layer P_CH and the pipe gate PG may be used as a gate insulating layer, and second insulating structures between the second channel layers S_CH and D_CH and the word lines WL may be used as multi-function layers. The tunnel insulating layer may be formed of an insulating material through which charges can tunnel, for example, a silicon oxide layer. The data storage layer may be a material layer in which charges can be trapped, for example, a silicon nitride layer. The first oxide layer and the second oxide layer may be used as blocking insulating layers.

Insulating layers for composing the first insulating structure surrounding the first channel layer P_CH may be the same as insulating layers for composing the second insulating structures surrounding the second channel layers S_CH and D_CH. Alternatively, the first insulating structure surrounding the first channel layer P_CH may be formed in a simple manner compared to the second insulating structures of the insulating layer surrounding the second channel layers S_CH and D_CH. For example, the stacked number of the insulating layers for composing the first insulating structure interposed between the first channel layer P_CH and the pipe gate PG may be less than that of the insulating layer for composing the second insulating structures interposed between the second channel layers S_CH and D_CH and the word lines WL. Thus, it is possible to reduce a phenomenon in which charges are trapped in the gate insulating layer of the pipe transistor that includes the first insulating structure interposed between the first channel layer P_CH and the pipe gate PG. As a result, in this embodiment, a threshold voltage of the pipe transistor can be stably secured. In addition, this embodiment can increase reliability of a semiconductor device by stabilizing an operation characteristic of the pipe transistor. When the stacked number of the insulating layers for composing the first insulating structure is less than that for composing the second insulating structure, a thickness of the first insulating structure is smaller than that of the second insulating structure.

The first insulating structure and the second insulating structures will be specifically described later with reference to FIGS. 2A to 5B.

FIGS. 2A to 2K are cross-sectional views illustrating a method of manufacturing a cell string according to an embodiment of the present disclosure. Thus, wherever possible, the same reference numbers or characters will be used throughout the drawings to refer to the same or like parts.

Figure 2A:
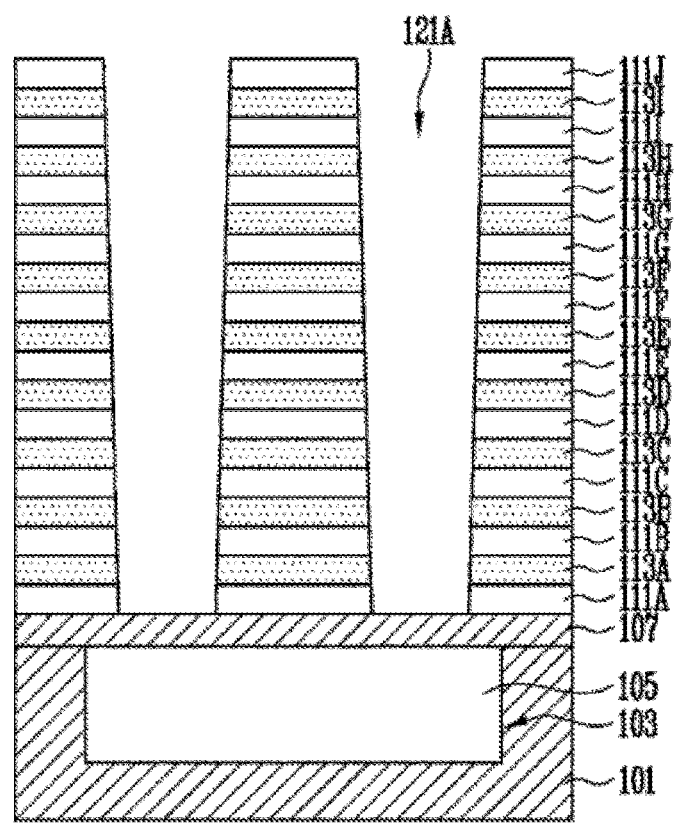

Referring to FIG. 2A, a first silicon layer 101 is formed on a substrate (not shown). Then, the first silicon layer 101 is etched to form a trench 103. The trench 103 may be arranged in the first silicon layer 101 in a matrix form. The interior of the trench 103 is filled with a first sacrificial layer 105. The first sacrificial layer 105 may be formed of a material layer having an etching selectivity with respect to the first silicon layer 101 and an oxide layer, for example, a titanium nitride (TiN) layer.

A second silicon layer 107 may be further formed on the first silicon layer 101 including the trench 103 filled with the first sacrificial layer 105.

Then, interlayer insulating layers 111A to 111J and second sacrificial layers 113A to 113I are alternately stacked on the second silicon layer 107. The interlayer insulating layers 111A to 111J may be formed of a silicon oxide layer. The second sacrificial layers 113A to 113I may be formed of a material layer having an etching selectivity with respect to the interlayer insulating layers 111A to 111J, for example, a silicon nitride layer.

Subsequently, first through-holes 121A, which penetrate the interlayer insulating layers 111A to 111J and the second sacrificial layers 113A to 113I, are formed. The first through-holes 121A may be formed by forming a mask pattern (not shown) defining a position of the first through-holes 121A on the interlayer insulating layers 111A to 111J and the second sacrificial layers 113A to 113I, etching the interlayer insulating layers 111A to 111J and the second sacrificial layers 113A to 113I using the mask pattern as an etching barrier, and removing the mask pattern. For example, the first through-holes 121A may be arranged along a line, such as y direction of the FIG. 1. Further, the first through-holes 121A may be disposed on both edge areas of the trench 103. Sidewalls of first through-holes 121A may be formed to be inclined, and widths of the first through-holes 121A may be gradually decreased toward a lower portion adjacent to the second silicon layer 107.

Referring to FIG. 2B, first oxide layers 131 are formed along sidewalls of the first through-holes 121A. The first oxide layers 131 are formed of an oxide having a bad step coverage characteristic to be deposited to a non-uniform thickness. The first oxide layers 131 are formed to be thinner toward a lower portion thereof, and formed to a smaller depth than the first though-holes 121A to expose lower sidewalls of the first though-holes 121A. Namely, the first oxide layers 131 are formed to surround upper sidewalls of the first though-holes 121A. Accordingly, the first oxide layers 131 open at least one of the interlayer insulating layers (for example, 111A and 111B) from the lower portion adjacent to the trench 103, and at least one of the second sacrificial layers (for example, 113A, 113B, 113C, and 113D) from the lower portion adjacent to the trench 103. In this way, sidewall slopes of the first through-holes 121A can be alleviated by the first oxide layers 131.

Referring to FIG. 2C, the second silicon layer 107, which is exposed through the first through-holes 121A, is etched to form a second through-holes 121B connected to the first through-holes 121A and exposing the first sacrificial layer 105.

Figure 2D:
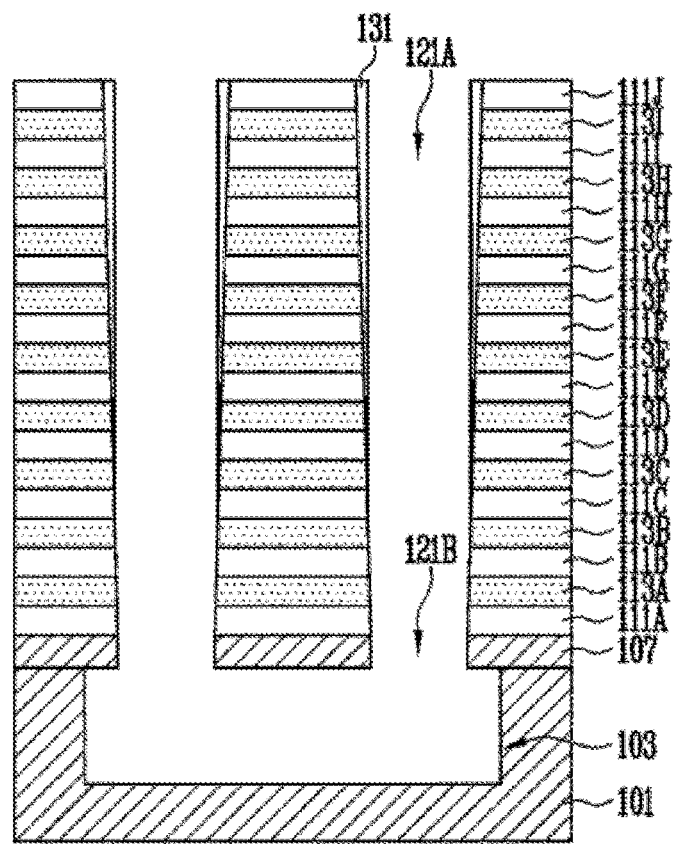

Referring to FIG. 2D, the first sacrificial layer 105 is removed to open the trench 103 by an etching process.

Figure 2E:
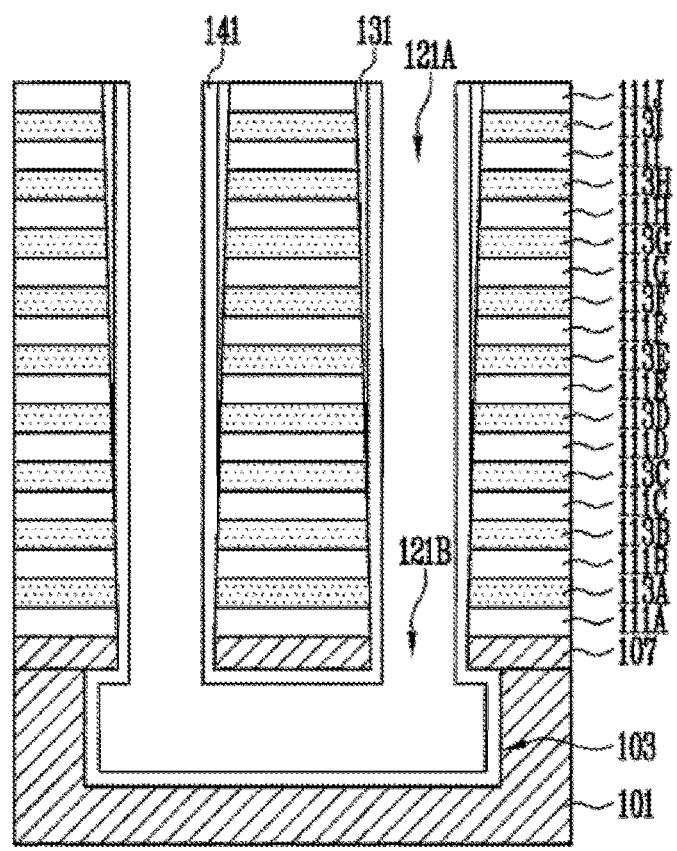

Referring to FIG. 2E, a metal layer 141 is formed along the surfaces of the first through-holes 121A, the second through-holes 121B, and the trench 103. For example, the metal layer 141 may be formed of nickel (Ni) or cobalt (Co).

Figure 2F:
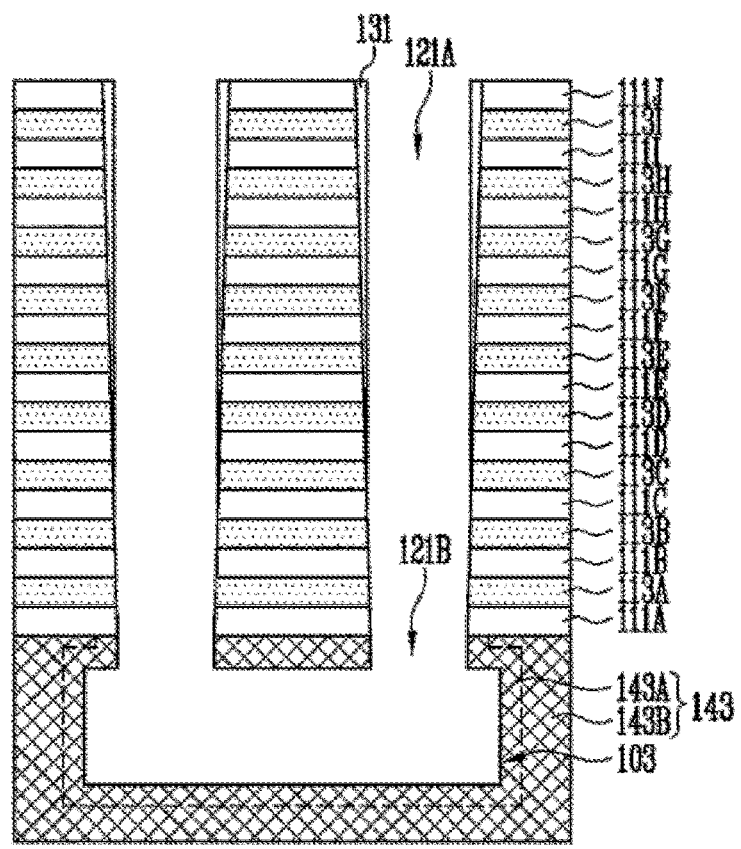

Referring to FIG. 2F, a pipe gate 143 including a metal silicide layer is formed by reacting the metal layer 141 with the first and second silicon layers 101 and 107 using a silicidation process. The silicidation process may include an annealing process of applying heat to enable a metal from the metal layer 141 to diffuse into the first and second silicon layers 101 and 107, and a process of removing a remaining metal layer 141 that does not react with the first and second silicon layers 101 and 107.

The pipe gate 143 may include a first area 143A surrounding the trench 103 and a second area 143B surrounding the first area 143A. The silicidation process may be performed such that all of the first and second silicon layers 101 and 107 react with the metal layer 141 to allow the first and second areas 143A and 143B of the pipe gate 143 to become the metal silicide layer. Alternatively, the silicidation process may be performed such that a part of the first silicon layer 101 and a part of the second silicon layer 107 adjacent to the metal layer 141 are reacted with the metal layer 141 to form the first area 143A of the pipe gate 143 which is composed of the metal silicide layer and the second area 143B is not reacted with the metal layer 141. The second area 143B of the pipe gate 143 includes a silicon layer.

Figure 2G:
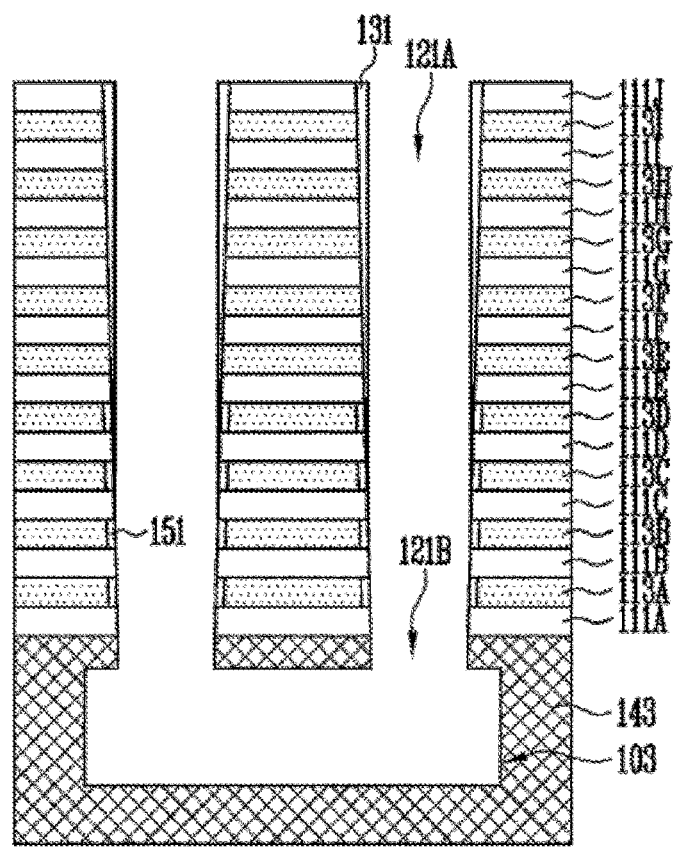

Referring to FIG. 2G, after the formation of the pipe gate 143 including the metal silicide layer, the second sacrificial layers 113A, 113B, 113C, and 113D opened by the first oxide layers 131 are selectively oxidized to form second oxide layers 151 on the sidewalls of the second sacrificial layers 113A, 113B, 113C, and 113D. Before the oxidation process of forming the second oxide layers 151, a surface of the pipe gate 143 opened by the trench 103 has been subjected to silicidation. The oxidation process of forming the second oxide layers 151 is selectively performed using the second sacrificial layers 113A, 113B, 113C, and 113D formed of a silicon nitride layer as a target, and thus the second oxide layers 151 are not formed on a surface of the silicided pipe gate 143.

As described above, since the second oxide layers 151 are formed on the lower sidewalls of the first through-holes 121A through the selective oxidation process instead of an oxide layer deposition process, the lower portion widths of the first through-holes 121A can be secured wide without being narrow despite the formation of the second oxide layers 151.

Figure 2H:
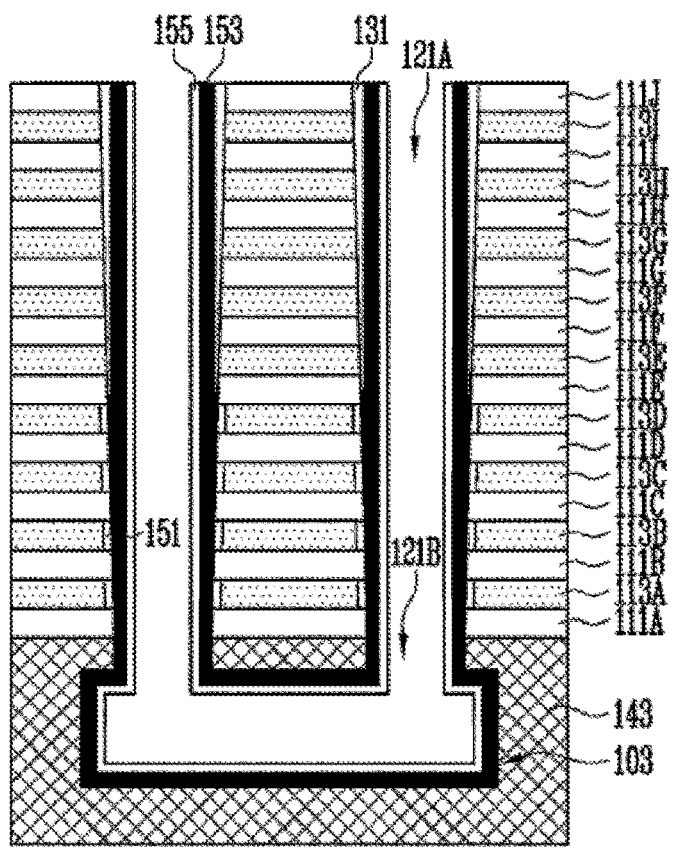

Referring to FIG. 2H, a data storage layer 153 is formed along a surface of the resultant structure on which the first oxide layers 131 is formed. The data storage layer 153 is formed along the surfaces of the first and second through-holes 121A and 121B and the trench 103. The date storage layer 153 is in contact with the first and second oxide layers 131 and 151 and the pipe gate 143. The data storage layer 153 is formed of a material layer in which charges can be trapped, for example, a silicon nitride layer. Then, a tunnel insulating layer 155 which is in contact with the data storage layer 153 is formed along the data storage layer 153. The tunnel insulating layer 155 is formed of an insulating material through which charges can tunnel, for example, a silicon oxide layer.

Figure 2I:
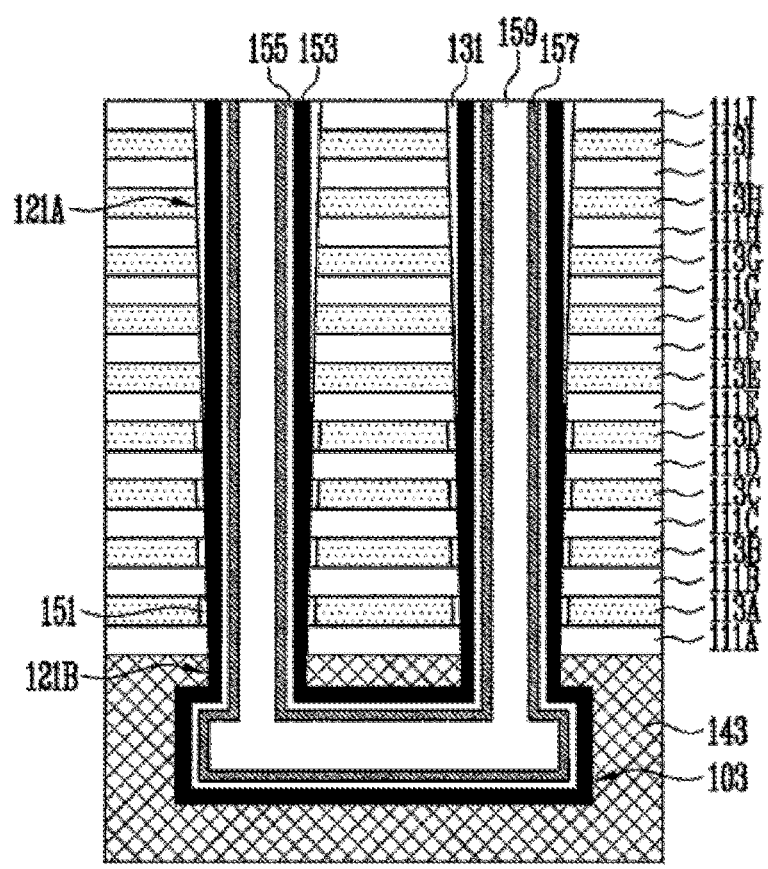

Referring to FIG. 2I, a channel layer 157 is formed along the tunnel insulating layer 155. The channel layer 157 is in contact with the tunnel insulating layer 155. The channel layer 157 is formed of a semiconductor material such as silicon. The channel layer 157 may be formed along surfaces of the first and second through-holes 121A and 121B, and the trench 103 in a hollow tube shape. In this case, an insulating layer 159 may be formed in an area surrounded by the channel layer 157, such as an inner portion of the hollow tube to be filled therein. The insulating layer 159 may be formed using PSZ (polysilazane) having an excellent gap-fill property. The channel layer 157 may be formed to fill the first and second through-holes 121A and 121B, and the trench 103.

Figure 2J:
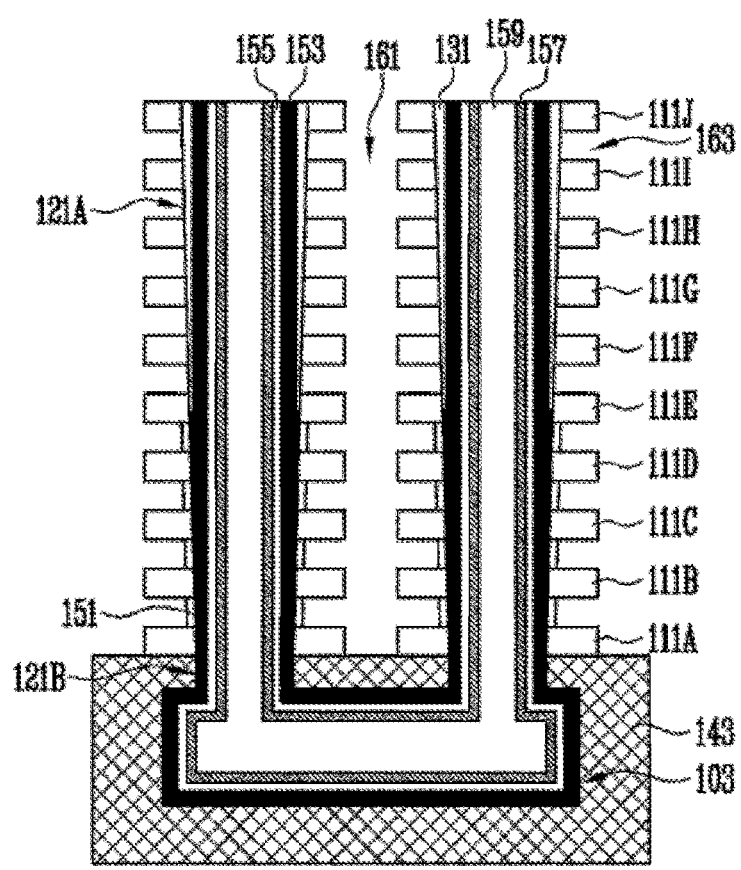

Referring to FIG. 2J, a slit 161, which penetrates the interlayer insulating layers 111A to 111J and the second sacrificial layers 113A to 113I between the first through-holes 121A, is formed. Then, the second sacrificial layers 113A to 113I, which are exposed through the slit 161, are selectively removed to form recess areas 163.

Figure 2K:
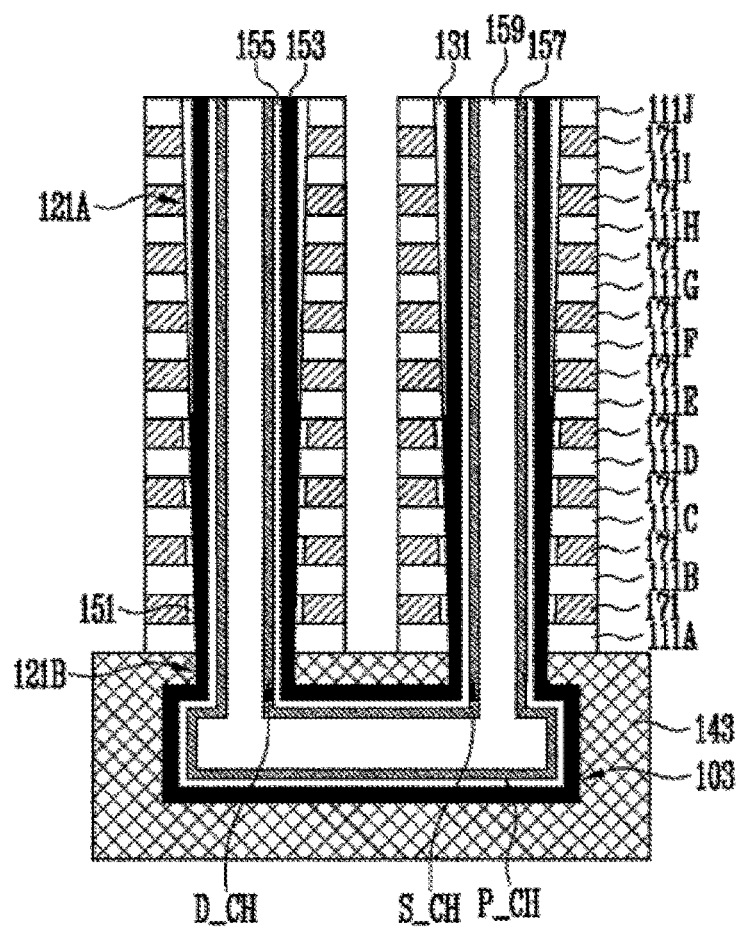

Referring to FIG. 2K, conductive patterns 171 are formed by burying a conductive material inside of the recess areas 163. The conductive patterns 171 includes barrier metal layers (not shown) formed along surfaces of the recess areas 163, and metal layers formed on the barrier metal layers to fill the recess areas 163. In this case, as the metal layers, tungsten, which is a low resistance metal, may be used. Before the conductive patterns 171 are formed, a blocking insulating layer (not shown) may be further formed along the surfaces of the recess areas 163.

According to the embodiment of the present disclosure described above, since the pipe gate 143 includes the silicide area having a lower resistance than the silicon layer, the pipe gate 143 may be formed to have a low resistance. The channel layer 157 includes the first channel layer P_CH formed in the trench 103 and the second channel layers S_CH and D_CH formed in the first through-holes 121A and second through-holes 121B connected to both ends of the trench 103. The first channel layer P_CH is surrounded by the silicide area of the pipe gate 143. The conductive patterns 171 is formed to surround the second channel layers S_CH and D_CH, and may be used as the word lines WL, the drain select line DSL, or the source select line SSL illustrated in FIG. 1.

According to the embodiment of the present disclosure, a gate insulting layer of the pipe transistor that is formed in a double-layered structure of the data storage layer 153 and the tunnel insulating layer 155 is interposed between the first channel layer P_CH and the pipe gate 143. A triple-layered structure of the first oxide layer 131, the data storage layer 153, and the tunnel insulating layer 155, or a triple-layered structure of the second oxide layer 151, the data storage layer 153, and the tunnel insulating layer 155 is interposed between the second channel layers S_CH and D_CH and the conductive patterns 171. The first oxide layers 131 are formed to surround some area of the data storage layer 153 surrounding the upper sidewalls of the second channel layers S_CH and D_CH. The second oxide layers 151 are interposed between at least one conductive pattern from the lowermost layer of the conductive patterns 171 and the data storage layer 153.

In the embodiment of the present disclosure, after the pipe gate 143 is silicided, the second oxide layer 151 is formed through a selective oxidation process such that the pipe gate 143 including the silicide area is not oxidized. Accordingly, in the embodiment of the present disclosure, a gate insulating layer structure of the pipe transistor can be simplified compared to a stacked structure of insulating layers between the second channel layers S_CH and D_CH and the conductive patterns 171, so that it is possible to reduce a phenomenon in which charges are trapped in the gate insulating layer of the pipe transistor.

FIGS. 3A to 3E are cross-sectional views illustrating a method of manufacturing a cell string according to another embodiment of the present disclosure.

Figure 3A:
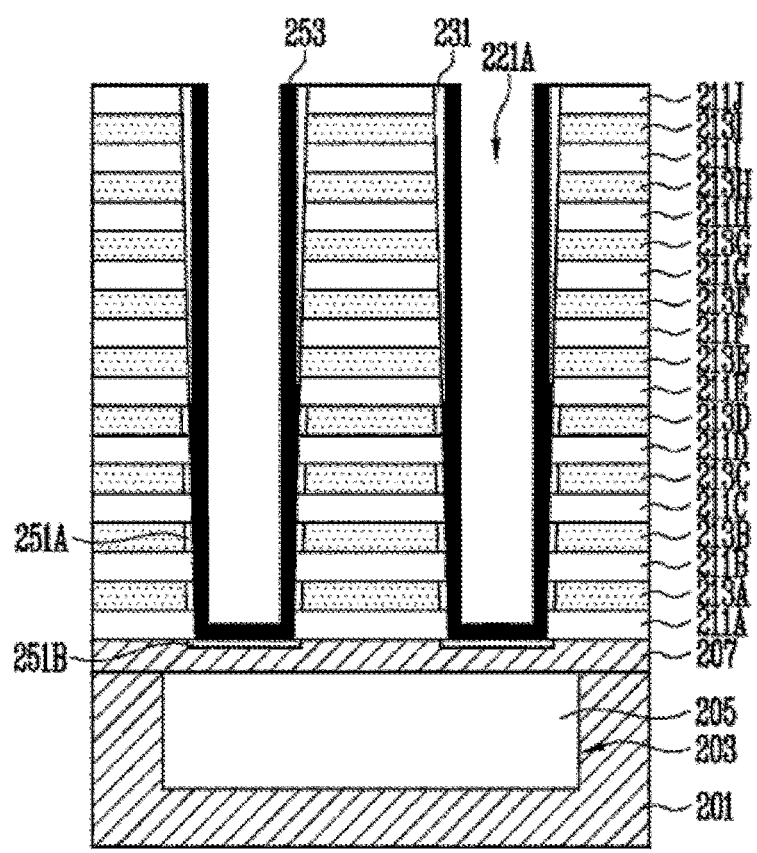

Referring to FIG. 3A, a first silicon layer 201, which includes a trench 203 filled with a first sacrificial layer 205, is formed on a substrate (not shown). Then, a second silicon layer 207 may be further formed on the first silicon layer 201. The first silicon layer 201, the trench 203, the first sacrificial layer 205, and the second silicon layer 207 may be formed using the processes and materials described in FIG. 2A.

Then, interlayer insulating layers 211A to 211J and second sacrificial layers 213A to 213I are alternately stacked on the second silicon layer 207. The interlayer insulating layers 211A to 211J and the second sacrificial layers 213A to 213I may be formed using the materials described in FIG. 2A.

First through holes 221A passing through the interlayer insulating layers 211A to 211J and the second sacrificial layers 213A to 213I are formed. The first through holes 221A may be formed using the processes described in FIG. 2A.

Then, first oxide layers 231 are formed along sidewalls of the first through-holes 221A. The first oxide layers 231 are formed of an oxide having a bad step coverage characteristic to be deposited to a non-uniform thickness. The first oxide layers 231 are formed to be gradually thinner toward a lower portion thereof, and formed along upper sidewalls of the first though-holes 221A to a smaller depth than the first though-holes 221A. Accordingly, the first oxide layers 231 open at least one of the interlayer insulating layers (for example 211A and 211B) from the lowermost layer adjacent to the trench 203, and at least one of the second sacrificial layers (213A, 213B, 213C, and 213D) from the lowermost layer adjacent to the trench 203. In this way, sidewall slopes of the first through-holes 221A can be alleviated by the first oxide layers 231.

The second sacrificial layers 213A, 213B, 213C, and 213D opened by the first oxide layers 231 are selectively oxidized to form second oxide layers 251A on the sidewalls of the second sacrificial layers 213A, 213B, 213C, and 213D. When an oxidation process of forming the second oxide layers 251A is performed, if the second silicon layer 207 is in an exposed state, some areas of the second silicon layer 207 exposed through the first through-holes 221A are oxidized to form third oxide layers 251B.

As described above, since the second oxide layers 251A are formed on the lower sidewalls of the first through-holes 221A through the selective oxidation process instead of an oxide layer deposition process, widths of the lower portion of the first through-holes 221A can be secured wide without being narrow despite the formation of the second oxide layers 251A.

Data storage layers 253 are formed along the surface of the first through-holes 221A. The data storage layers 253 are formed in contact with the first to third oxide layers 231, 251A, and 251B. The data storage layers 253 may be formed of a material layer in which charges can be trapped, for example, a silicon nitride layer.

Referring to FIG. 3B, a part of the data storage layers 253, which is formed on the bottom surface of the first through-holes 221A, is removed to expose the third oxide layers 251B, and then the exposed third oxide layers 251B are removed. The second silicon layer 207 is exposed through areas in which the third oxide layers 251B are removed. Then, the exposed second silicon layer 207 is removed. In this way, second through-holes 221B is formed in the second silicon layer 207. The second through-holes 221B may be connected the trench 203. Thus, the first sacrificial layer 205 are exposed by the second through-holes 221B. Then, the first sacrificial layer 205 exposed through the second through-holes 221B is removed to open the trench 203.

Figure 3C:
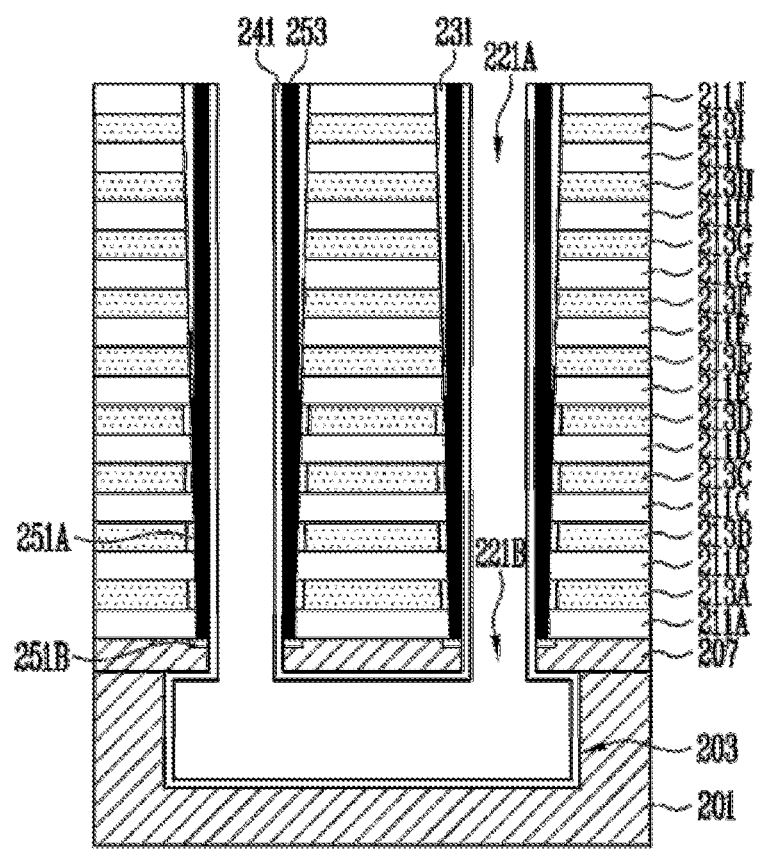

Referring to FIG. 3C, a metal layer 241 is formed along surfaces of the first through-holes 221A, the second through-holes 221B, and the trench 203. For example, the metal layer 241 may be formed of nickel (Ni) or cobalt (Co).

Figure 3D:
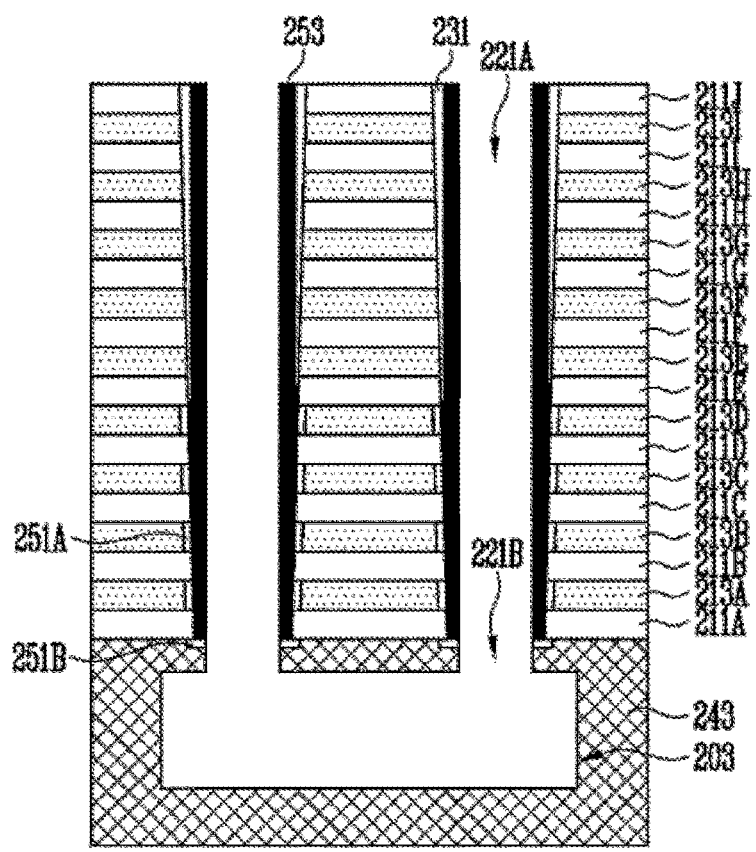

Referring to FIG. 3D, a pipe gate 243 including a metal silicide layer is formed by reacting the metal layer 241 with the first and second silicon layers 201 and 207 using a silicidation process. The silicidation process is the same as that described in FIG. 2F. The pipe gate 243 may be formed of a silicide area or may include a silicide area surrounding the trench 203 and a silicon area surrounding the silicide area as described in FIG. 2F.

Figure 3E:
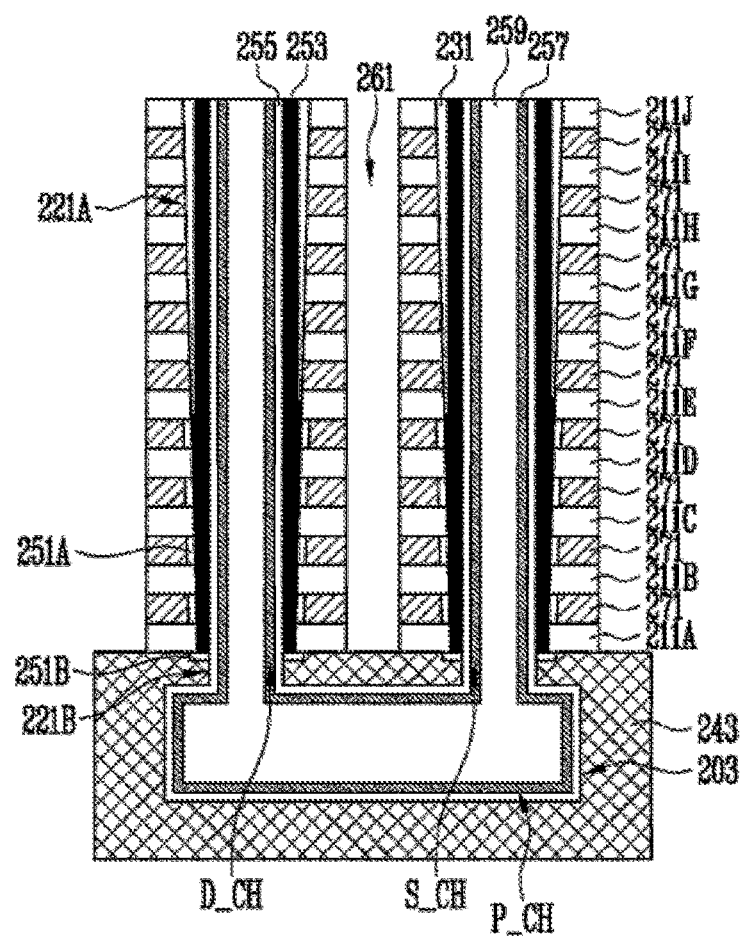

Referring to FIG. 3E, after the pipe gate 243 including the metal silicide layer is formed, a tunnel insulating layer 255 is formed along surfaces of the first through-holes 221A, the second through-holes 221B, and the trench 203. The tunnel insulating layer 255 is in contact with the data storage layer 253 and the silicide area of the pipe gate 243. The tunnel insulating layer 255 may be formed of an insulating material through which charges can tunnel, for example, a silicon oxide layer.

Subsequently, a channel layer 257 is formed along the tunnel insulating layer 255. The channel layer 257 is in contact with the tunnel insulating layer 255. The channel layer 257 is formed of a semiconductor material such as silicon. The channel layer 257 may be formed along surfaces of the first and second through-holes 221A and 221B, and the trench 203 in a hollow tube shape. In this case, an insulating layer 259, which fills the central area of the channel layer 257, may be further formed. The insulating layer 259 may be formed using PSZ (polysilazane) having an excellent gap-fill property. The channel layer 257 may be formed to fill the first and second through-holes 221A and 221B, and the trench 203 in a different manner from the illustration of FIG. 3E.

Then, using the process described in FIG. 2J, a slit 261, which penetrates the interlayer insulating layers 211A to 211J and the second sacrificial layers 213A to 213I between the first through-holes 221A, is formed, and then the second sacrificial layers 213A to 213I are selectively removed. Then, using the process described in FIG. 2K, conductive patterns 271 are formed in areas from which the second sacrificial layers 213A to 213I are removed. The first oxide layers 231 or the second oxide layers 251A remaining between the conductive patterns 271 and the data storage layers 253 may function as a blocking insulating layer.

According to another embodiment of the present disclosure described above, the pipe gate 243 includes a silicide area, thereby having a low resistance. The channel layer 257 includes the first channel layer P_CH formed in the trench 203 and the second channel layers S_CH and D_CH formed in the first through-holes 221A and the second through-holes 221B connected to both edge areas of the trench 203. The first channel layer P_CH is surrounded by the silicide area of the pipe gate 243. The conductive patterns 271 is formed to surround the second channel layers S_CH and D_CH, and may be used as the word lines WL, the drain select line DSL, or the source select line SSL illustrated in FIG. 1.

According to another embodiment of the present disclosure, a gate insulating layer of the pipe transistor that is formed in a single-layered structure of the tunnel insulating layer 255 is interposed between the first channel layer P_CH and the pipe gate 243. A triple-layered structure of the first oxide layer 231, the data storage layer 253, and the tunnel insulating layer 255, or a triple-layered structure of the second oxide layer 251A, the data storage layer 253, and the tunnel insulating layer 255 is interposed between the second channel layers S_CH and D_CH and the conductive patterns 271. The first oxide layers 231 are formed to surround some area of the data storage layer 253 surrounding the upper sidewall of the second channel layers S_CH and D_CH. The second oxide layers 251A are interposed between at least one conductive pattern from the lowermost layer of the conductive patterns 271 and the data storage layer 253.

In this way, in another embodiment of the present disclosure, before removing the first sacrificial layer 205 in the trench 203, the first and second oxide layers 231 and 251A, and the data storage layers 253 are formed. Therefore the first and second oxide layers 231 and 251A as the blocking insulating layer and the data storage layers 253 are not formed in the trench 203 of the pipe gate 243. Accordingly, a gate insulating layer structure of the pipe transistor can be simplified compared to a stacked structure of insulating layers between the second channel layers S_CH and D_CH and the conductive patterns 271, so that it is possible to reduce a phenomenon in which charges are trapped in the gate insulating layer of the pipe transistor.

FIGS. 4A to 4D are cross-sectional views illustrating a method of manufacturing a cell string according to still another embodiment of the present disclosure.

Figure 4A:
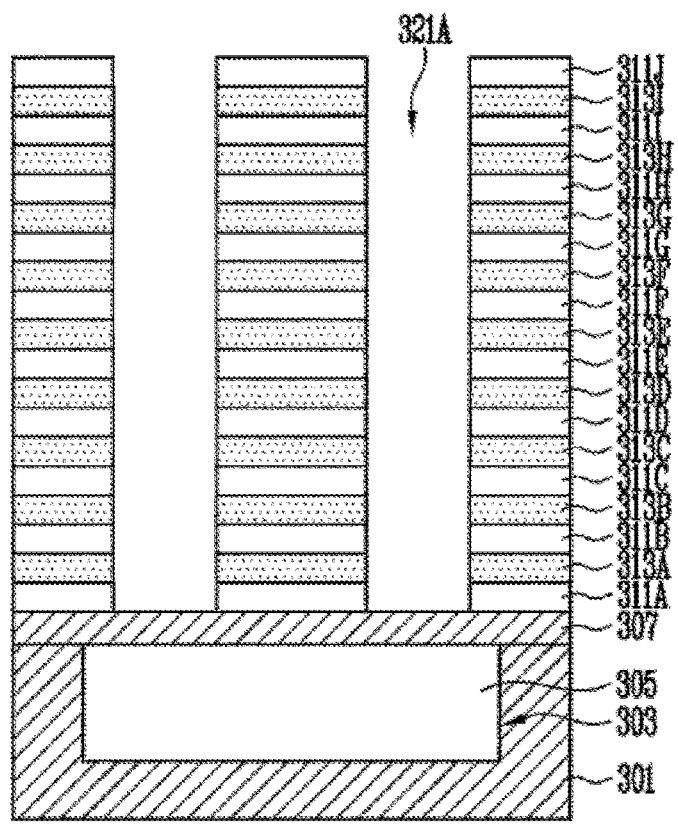
FIGS. 4A to 4D are cross-sectional views illustrating a method of manufacturing a cell string according to still another embodiment of the present disclosure.

Referring to FIG. 4A, a first silicon layer 301, which includes a trench 303 filled with a first sacrificial layer 305, is formed on a substrate (not shown). Then, a second silicon layer 307 may be further formed on the first silicon layer 301. The first silicon layer 301, the trench 303, the first sacrificial layer 305, and the second silicon layer 307 may be formed using the processes and materials described in FIG. 2A.

Then, interlayer insulating layers 311A to 311J, and second sacrificial layers 313A to 313I are alternately stacked on the second silicon layer 307. The interlayer insulating layers 311A to 311J and the second sacrificial layers 313A to 313I may be formed using the materials described in FIG. 2A.

Then, first through-holes 321A, which penetrate the interlayer insulating layers 311A to 311J and the second sacrificial layers 313A to 313I, are formed. The first through-holes 321A may be formed using the processes described in FIG. 2A. Sidewalls of the first through-holes 321A according to still another embodiment of the present disclosure are formed to be substantially perpendicular to a surface of the substrate.

In this case, the first through-holes 321A may be formed to have a uniform width from an upper portion to a lower portion.

Figure 4B:
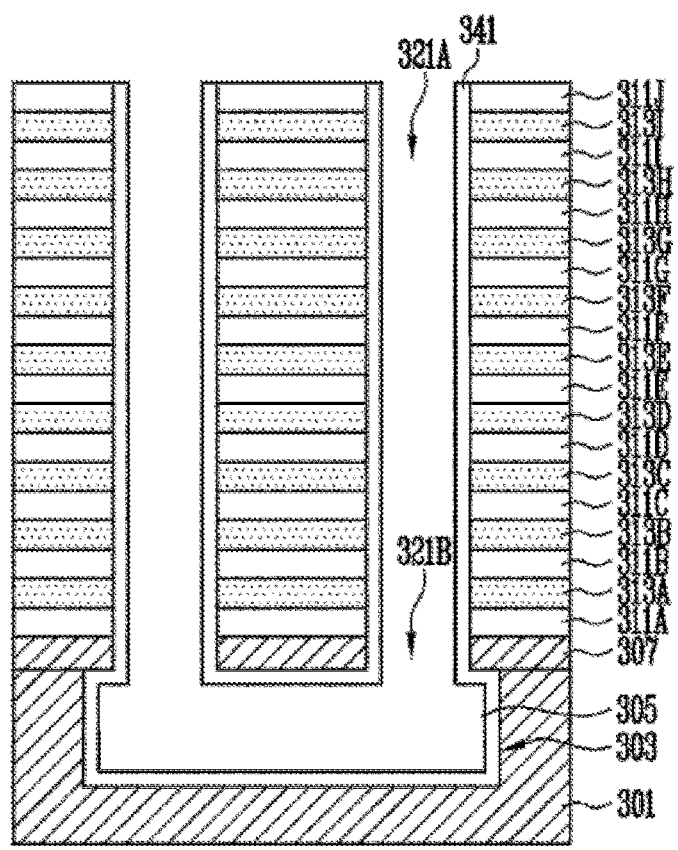

Referring to FIG. 4B, the second silicon layer 307 exposed through the first through-holes 321A is etched to form second through-holes 321B connected to the first through-holes 321A and exposing the first sacrificial layer 305. Then, the first sacrificial layer 305 is removed to open the trench 303.

Then, a metal layer 341 is formed along surfaces of the first through-holes 321A, the second through-holes 321B, and the trench 303. For example, the metal layer 341 may be formed of nickel (Ni) or cobalt (Co).

Figure 4C:
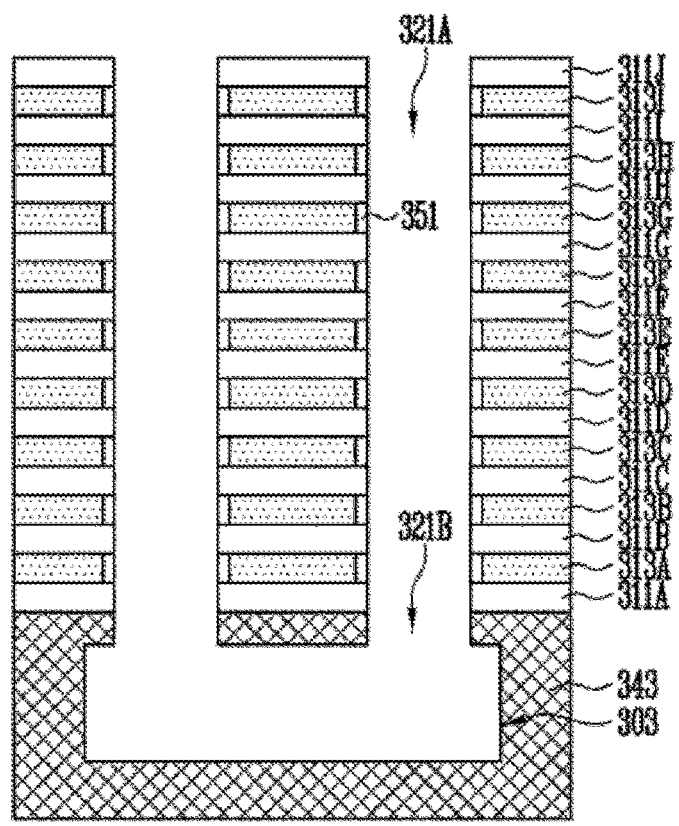

Referring to FIG. 4C, a pipe gate 343 including a metal silicide layer is formed by reacting the metal layer 341 with the first and second silicon layers 301 and 307 using a silicidation process. The silicidation process is the same as that described in FIG. 2F. The pipe gate 343 may be formed of a silicide area or include a silicide area surrounding the trench 303 and a silicon area surrounding the silicide area as described in FIG. 2F.

After the formation of the pipe gate 343 including the metal silicide layer, subsequent processes according to various embodiments are followed. First, in still another embodiment of the present disclosure, the pipe gate 343 including the metal silicide layer is formed, and then sidewalls of the second sacrificial layers 313A to 313I opened by the first through-holes 321A are selectively oxidized to form oxide layers 351 on the sidewalls of the second sacrificial layers 313A to 313I. Before performing the oxidation process of forming the oxide layer 351, a surface of the pipe gate 343 opened by the trench 303 has been subjected to silicidation. The oxidation process of forming the oxide layer 351 is selectively performed using the second sacrificial layers 313A to 313I formed of a silicon nitride layer as a target, and thus the oxide layers 351 are not formed on a surface of the silicided pipe gate 343.

As described above, since the oxide layers 351 are formed on sidewalls of the first through-holes 321A through the selective oxidation process instead of an oxide layer deposition process, widths of the lower portion of the first through-holes 321A can be secured wide without being narrow despite the formation of the oxide layers 351. In addition, the oxide layers 351 are formed in a divided structure with the interlayer insulating layers 311A to 311J interposed therebetween.

Figure 4D:
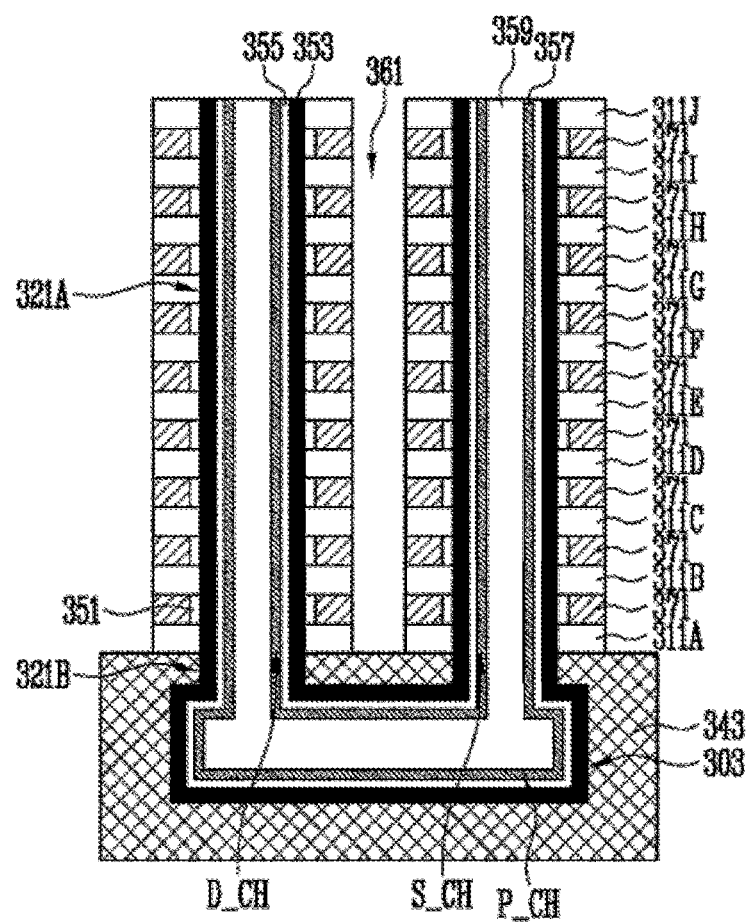

Referring to FIG. 4D, a data storage layer 353 contacting the oxide layers 351, the interlayer insulating layers 311A to 311J, and the metal silicide layer of the pipe gate 343 is formed along surfaces of the first through-holes 321A, the second through-holes 321B, and the trench 303. The data storage layer 353 is formed of a material layer in which charges can be trapped, for example, a silicon nitride layer. Then, a tunnel insulating layer 355 which is in contact with the data storage layer 353 is formed along the data storage layer 353. The tunnel insulating layer 355 is formed of an insulating material through which charges can tunnel, for example, a silicon oxide layer. Subsequently, a channel layer 357 in contact with the tunnel insulating layer 355 is formed along the tunnel insulating layer 355. The channel layer 357 is formed of a semiconductor material such as silicon. The channel layer 357 may be formed along surfaces of the first and second through-holes 321A and 321B, and the trench 303 in a hollow tube shape. In this case, an insulating layer 359 may be formed in an area surrounded by the channel layer 157, such as an inner portion of the hollow tube. The insulating layer 359 may be formed using PSZ (polysilazane) having an excellent gap-fill property. The channel layer 357 may be formed to fill the first and second through-holes 321A and 321B, and the trench 303 in a different manner from the illustration of FIG. 4D.

Using the process described in FIG. 2J, a slit 361, which penetrates the interlayer insulating layers 311A to 311J and the second sacrificial layers 313A to 313I between the first through-holes 321A, is formed, and then the second sacrificial layers 313A to 313I are selectively removed. Then, using the process described in FIG. 2K, conductive patterns 371 are formed in areas in which the second sacrificial layers 313A to 313I are removed. The oxide layers 351 remaining between conductive patterns 371 and the data storage layers 353 may function as a blocking insulating layer.

According to still another embodiment of the present disclosure described above, since the pipe gate 343 includes a silicide area having a lower resistance than the silicon layer, the pipe gate 343 may be formed to have a low resistance. The channel layer 357 includes the first channel layer P_CH formed in the trench 303 and the second channel layers S_CH and D_CH formed in the first through-holes 321A and the second through-holes 321B connected to both ends of the trench 303. The first channel layer P_CH is surrounded by the silicide area of the pipe gate 343. The conductive patterns 371 are formed to surround the second channel layers S_CH and D_CH, and may be used as the word lines WL, the drain select line DSL, or the source select line SSL illustrated in FIG. 1.

According to an embodiment of the present disclosure, a gate insulting layer of the pipe transistor that is formed in a double-layered structure of the data storage layer 353 and the tunnel insulating layer 355 is interposed between the first channel layer P_CH and the pipe gate 343. A triple-layered structure of the oxide layer 351, the data storage layer 353, and the tunnel insulating layer 355 is interposed between the second channel layers S_CH and D_CH and the conductive patterns 371.

In an embodiment of the present disclosure, in the same manner as the first embodiment, the oxide layer 351 is formed through the selective oxidation process such that the pipe gate 343 including the silicide area is not oxidized. Accordingly, a gate insulating layer structure of the pipe transistor can be simplified compared to a stacked structure of insulating layers between the second channel layers S_CH and D_CH and the conductive patterns 371, so that it is possible to reduce a phenomenon in which charges are trapped in the gate insulating layer of the pipe transistor.

Figure 5A:
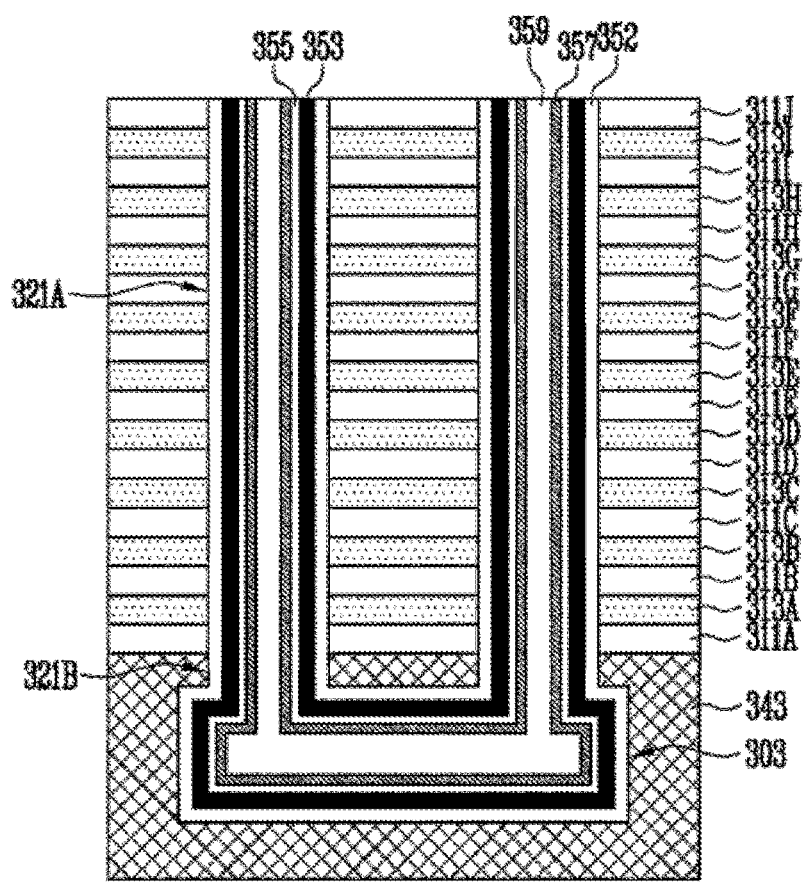
FIGS. 5A and 5B are cross-sectional views illustrating a method of manufacturing a cell string according to yet another embodiment of the present disclosure.
Figure 5B:
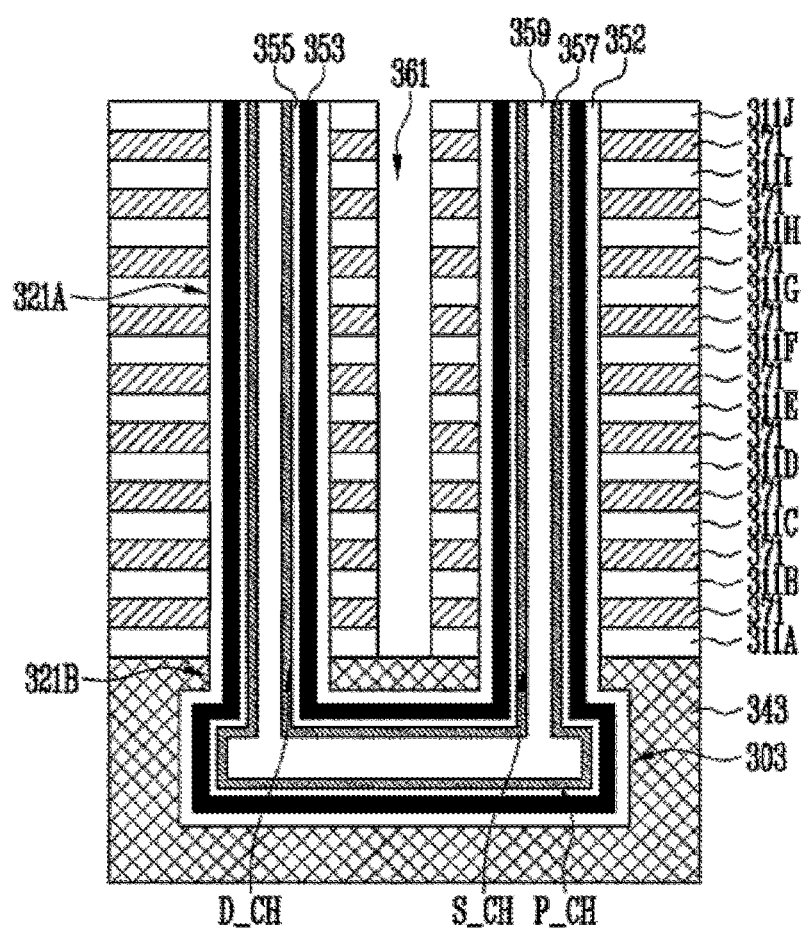

FIGS. 5A and 5B are cross-sectional views illustrating a method of manufacturing a cell string according to yet another embodiment of the present disclosure. In particular, FIGS. 5A and 5B are cross-sectional views illustrating other subsequent processes after forming the pipe gate 343 including the metal silicide layer described in FIG. 4C. Out of reference numerals of FIGS. 5A and 5B, the reference numerals indicating the same configurations as configurations described in FIGS. 4A to 4C are the same as that of FIGS. 4A to 4C. Hereinafter, for convenience of description, specific descriptions regarding duplicate reference numerals will not be provided.

Referring to FIG. 5A, after the pipe gate 343 including the metal silicide layer is formed using the processes and materials described in FIGS. 4A to 4C, an oxide layer 352 serving as a blocking insulating layer is formed along the surfaces of the first through-hole 321A, the second through-holes 321B, and the trench 303 using a deposition process. Then, using the materials described in FIG. 4D, the data storage layer 353, the tunnel insulating layer 355, the channel layer 357, and the insulating layer 359 are formed along the oxide layer 352.

Referring to FIG. 5B, using the process described in FIG. 2J, the slit 361, which penetrates the interlayer insulating layers 311A to 311J and the second sacrificial layers 313A to 313I between the first through-holes 321A, is formed, and then the second sacrificial layers 313A to 313I are selectively removed. Subsequently, using the process described in FIG. 2K, the conductive patterns 371 are formed in areas in which the second sacrificial layers 313A to 313I are removed.

According to yet another embodiment of the present disclosure described above, since the pipe gate 343 includes the silicide area having a lower resistance than the silicon layer, the pipe gate 343 may be formed to have a low resistance. The channel layer 357 includes the first channel layer P_CH formed in the trench 303 and the second channel layers S_CH and D_CH formed in the first through-holes 321A and the second through-holes 321B connected to both ends of the trench 303. The first channel layer P_CH is surrounded by the silicide area of the pipe gate 343. The conductive patterns 371 are formed to surround the second channel layers S_CH and D_CH, and may be used as the word lines WL, the drain select line DSL, or the source select line SSL illustrated in FIG. 1.

According to an embodiment of the present disclosure, a gate insulting layer of the pipe transistor that is formed in a triple-layered structure of the oxide layer 352, the data storage layer 353, and the tunnel insulating layer 355 is interposed between the first channel layer P_CH and the pipe gate 343. The oxide layer 352 serving as the blocking insulating layer may be formed in contact with the silicide area of the pipe gate 343. A triple-layered structure of the oxide layer 352, the data storage layer 353, and the tunnel insulating layer 355 is interposed between the second channel layers S_CH and D_CH and the conductive patterns 371.

Figure 6:
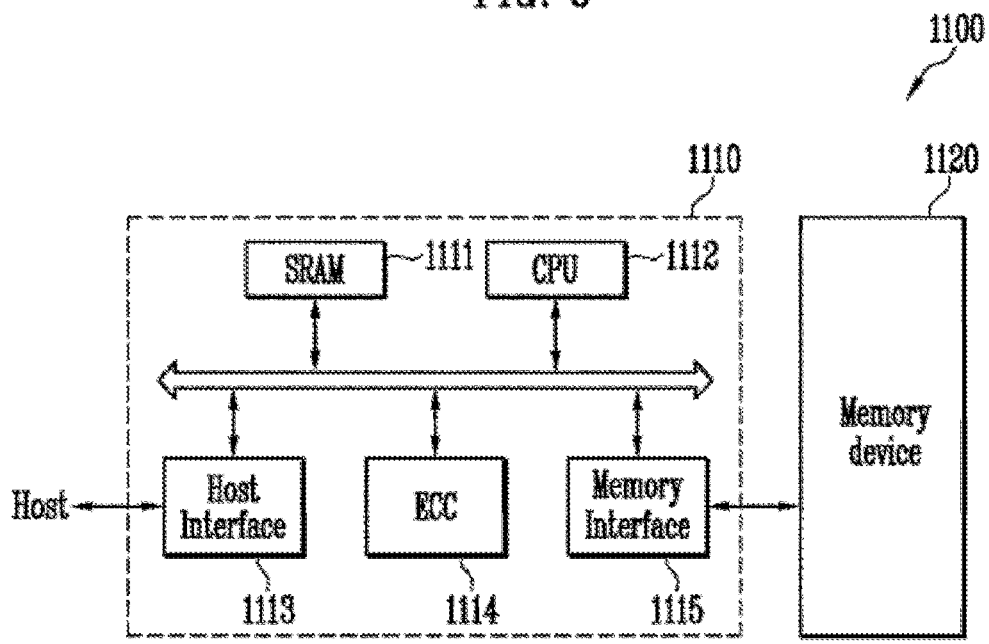
FIG. 6 is a diagram illustrating a configuration of a memory system according to an embodiment of the present disclosure.

FIG. 6 is a diagram illustrating a configuration of a memory system according to an embodiment of the present disclosure.

Referring to FIG. 6, a memory system 1100 according to the embodiment of the present embodiment includes a memory device 1120 and a memory controller 1110.

The memory device 1120 includes the cell string described with reference to the embodiments described in FIGS. 1 to 5B. In addition, the memory device 1120 may be a multi-chip package including a plurality of flash memory chips.

The memory controller 1110 is configured to control the memory device 1120, and includes an SRAM 1111, a CPU 1112, a host interface 1113, an ECC 1114, and a memory interface 1115. The SRAM 1111 is used as an operation memory of the CPU 1112. The CPU 1112 performs various control operations for exchanging data of the memory controller 1110. The host interface 1113 includes a data exchange protocol of a host, which is connected to the memory system 1100. In addition, the ECC 1114 detects and corrects errors included in data read from the memory device 1120. The memory interface 1115 performs an interfacing with the memory device 1120. In addition to these, the memory controller 1110 may further include a ROM storing code data for interfacing with the host.

The memory system 1100 having such a configuration may be a memory card or a solid state disk (SSD) connected with the memory device 1120 and the controller 1110. For example, when the memory system 1100 is an SSD, the memory controller 1110 can communicate with the outside through one of various interface protocols such as a USB, an MMC, a PCI-E, an SATA, a PATA, an SCSI, an ESDI, and an IDE.

Figure 7:
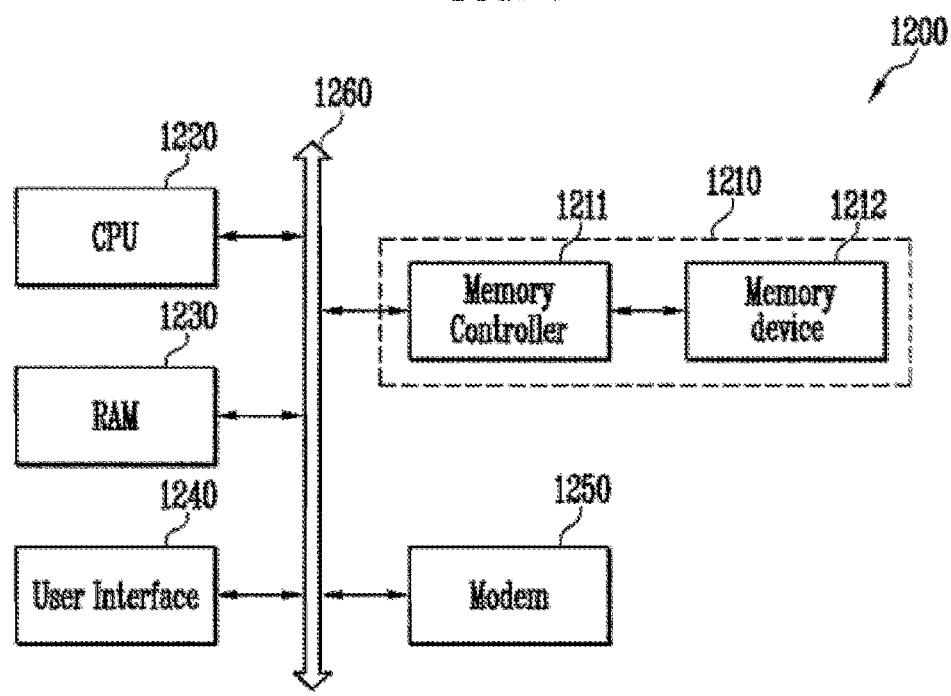
FIG. 7 is a diagram illustrating a configuration of a computing system according to an embodiment of the present disclosure.

FIG. 7 is a diagram illustrating a configuration of a computing system according to an embodiment of the present disclosure.

Referring to FIG. 7, a computing system 1200 according to the embodiment of the present disclosure may include a CPU 1220, a RAM 1230, a user interface 1240, a modem 1250, and a memory system 1210 electrically connected to a system bus 1260. In addition, when the computing system 1200 is a mobile device, a battery for supplying an operating voltage to the computing system 1200 may be further included, and an application chipset, a camera image processor (CIS), and a mobile DRAM may be further included.

The memory system 1210, as described above with reference to FIG. 6, may include a memory device 1212 and a memory controller 1211.

The invention can improve an operation characteristic of a pipe transistor by lowering gate resistance of the pipe transistor through a pipe gate including a silicide area.

In addition, the invention can improve an operation characteristic of a pipe transistor by forming an insulating structure interposed between a first channel layer of the pipe transistor and a pipe gate in a simple manner compared to an insulating structure interposed between a word line of a memory cell and a second channel layer of the memory cell.

It will be apparent to those skilled in the art that various modifications can be made to the above-described embodiments of the present disclosure without departing from the spirit or scope of the present disclosure. Thus, it is intended that the present disclosure covers all such modifications provided they come within the scope of the appended claims and their equivalents.

What is claimed is:

1. A method of manufacturing a semiconductor device, comprising:
   forming a structure including a silicon layer having a trench, and interlayer insulating layers and first sacrificial layers, which are alternately stacked on the silicon layer and penetrated through a through-hole connected to the trench,
   transforming the silicon layer into a metal silicide layer using a silicidation process;
   forming a slit penetrating the interlayer insulating layers and the first sacrificial layers;
   forming recess areas by removing the first sacrificial layers through the slit; and
   forming conductive layers in the recess areas,
   forming a channel layer in the trench and the through-hole connected to the trench, wherein the channel layer includes:
   a lower portion formed in the trench and formed along a surface of the metal silicide layer, and
   a protruding portion extending from the lower portion of the channel layer and formed in the through-hole, and
   wherein the silicidation process is performed after forming the first sacrificial layers and before removing the first sacrificial layers,
   wherein the forming of the structure includes:
   forming the trench by etching the silicon layer;
   filling the inside of the trench with a second sacrificial layer;
   alternately stacking the interlayer insulating layers and the first sacrificial layers on the second sacrificial layer and the silicon layer;
   forming the through-hole opening the second sacrificial layer through the interlayer insulating layers and the first sacrificial layers; and
   removing the second sacrificial layer.

2. The method of claim 1, before the silicidation process, further comprising
   forming a first oxide layer which becomes thinner as moving downward along a sidewall of the through-hole, and opens at least one of the interlayer insulting layers and at least one of the first sacrificial layers, from the lowermost layer.

3. The method of claim 1, after the silicidation process further comprising:
   forming a second oxide layer by oxidizing a sidewall of the first sacrificial layer opened through the first oxide layer;
   forming a data storage layer contacting the first oxide layer, the second oxide layer, and the metal silicide layer along surfaces of the through-hole and the trench; and
   forming a tunnel insulating layer along the data storage layer.

4. The method of claim 1, before the removing of the second sacrificial layer, further comprising:
   forming a first oxide layer which becomes thinner as moving downward along a sidewall of the through-hole, and opens at least one of the interlayer insulating layers and at least one of the first sacrificial layers from the lowermost layer;
   forming a second oxide layer by oxidizing a sidewall of the first sacrificial layer opened through the first oxide layer; and
   forming a data storage layer contacting the first and second oxide layers along the sidewall of the through-hole.

5. The method of claim 4, after the silicidation process, further comprising
   forming a tunnel insulating layer contacting the data storage layer and the metal silicide layer along surfaces of the through-hole and the trench.

6. The method of claim 1, after the silicidation process, further comprising:
   forming oxide layers by oxidizing sidewalls of the first sacrificial layers;
   forming a data storage layer contacting the interlayer insulating layers, the oxide layers, and the metal silicide layer along surfaces of the through-hole and the trench; and
   forming a tunnel insulating layer along the data storage layer.

7. The method of claim 1, after the silicidation process, further comprising:
   forming an oxide layer contacting the metal silicide layer along surfaces of the through-hole and the trench;
   forming a data storage layer along the oxide layer; and
   forming a tunnel insulating layer along the data storage layer.

* * * * *